United States Patent [19]
Lee

[11] Patent Number: 6,018,259
[45] Date of Patent: Jan. 25, 2000

[54] PHASE LOCKED DELAY CIRCUIT

[75] Inventor: Jung-bae Lee, Kyungki-do, Rep. of Korea

[73] Assignee: Samsung Electronics, Co., Ltd., Suwon, Rep. of Korea

[21] Appl. No.: 08/998,326

[22] Filed: Dec. 24, 1997

[30]       Foreign Application Priority Data

Feb. 5, 1997  [KR]   Rep. of Korea ......................... 97-3573

[51] Int. Cl.[7] ..................................................... H03K 5/14
[52] U.S. Cl. ........................... 327/159; 327/158; 327/161
[58] Field of Search ................................... 327/146, 147,
            327/149, 150, 153, 155, 156, 158, 159,
            161, 233–236, 243–244, 292, 269–271,
            276–278

[56]                  References Cited

U.S. PATENT DOCUMENTS 5,049,766   9/1991  Van Driest et al. ..................... 327/277
  5,708,382   1/1998  Park ........................................ 327/277

OTHER PUBLICATIONS

U.S. application No. 08/771,538, Lee, filed Dec. 23, 1996.

*Primary Examiner*—Terry D. Cunningham
*Assistant Examiner*—Eunja Adolphe
*Attorney, Agent, or Firm*—Marger Johnson & McCollom

[57]                   ABSTRACT

A phase locked delay circuit which reduces the layout area of a semiconductor device includes a delay buffer, a main delay portion, a delay line, means for detecting phase synchronization, a switching unit, a clock driver, and a flag signal generator. The delay buffer receives an external system clock signal, delays the received signal for a predetermined first delay time, and buffers the delayed signal. The main delay portion delays the output of the delay buffer for a predetermined second delay time in response to a flag signal, or bypasses the output of the delay buffer. The delay line sequentially delays the output of the main delay portion for a unit time. The phase synchronization detecting means detects a third delay time required for synchronizing the output of the main delay portion with the output of the delay buffer in response to the flag signal, using the output of the delay line, and activates a corresponding enable signal. The flag signal generator activates the flag signal only when the phase synchronization detecting means detects the third delay time. The switching unit is controlled by enable signals and switches a corresponding signal among signals output by the delay line. The clock driver delays the output of the switching for a fourth delay time and outputs the delayed signal as an internal clock signal.

26 Claims, 9 Drawing Sheets

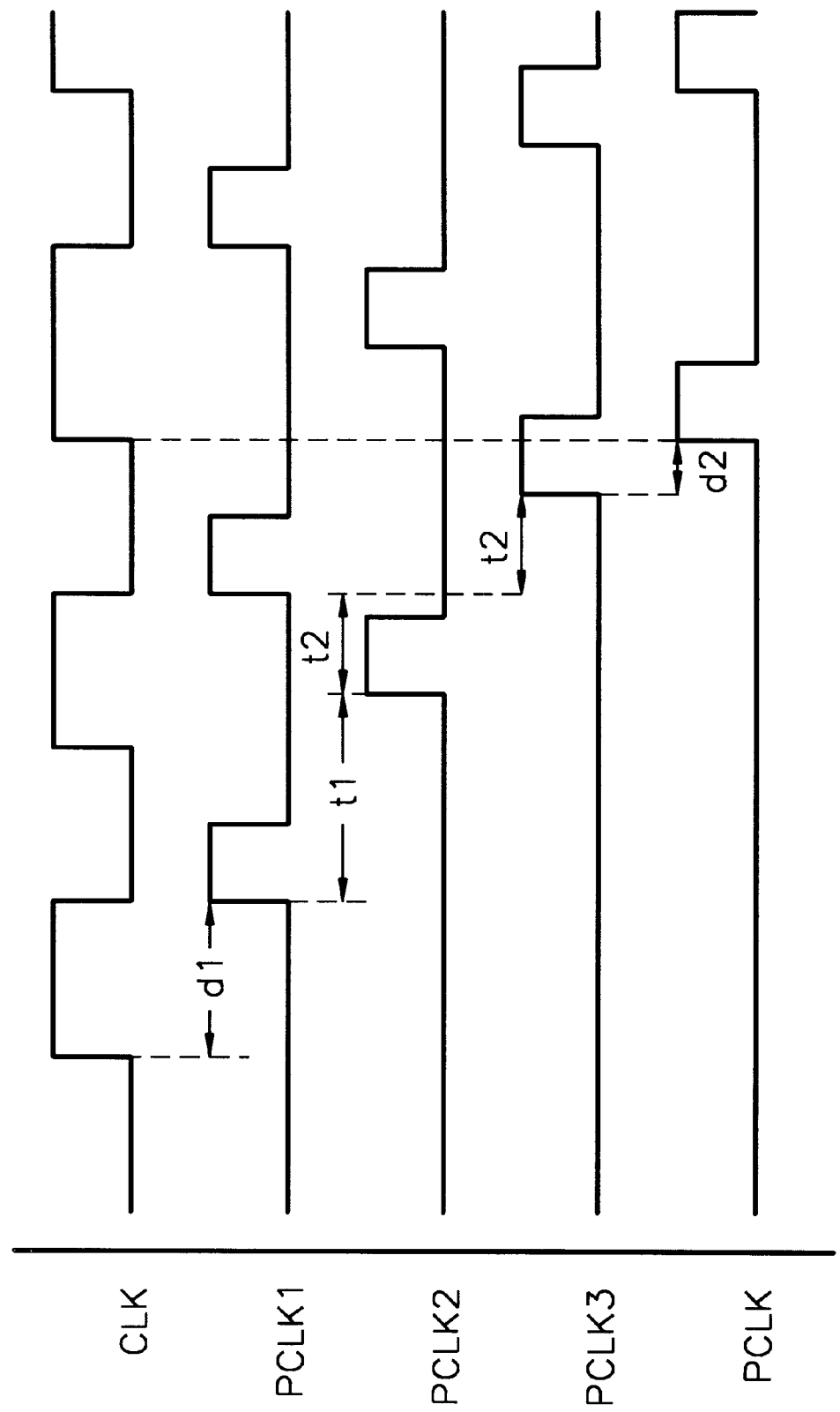

PHASE LOCKED DELAY CIRCUIT

BACKGROUND OF THE INVENTION

1. Field of the Invention

The present invention relates to a semiconductor memory device, and more particularly, to a phase locked delay circuit.

2. Description of the Related Art

A synchronous semiconductor memory device is provided with a clock buffer which receives an external system clock signal and converts the system clock signal to an internal clock signal needed for operating internal circuitry of the semiconductor chip such that internal clock signal is synchronized with the external system clock signal. A phase difference cannot be avoided between the external system and the internal clock signals. Researchers have worked to remove this phase difference by generating an internal clock in perfect synchronization with an external system clock signal.

One approach developed to minimize the phase difference between external system clock CLK and internal clock PCLK involves using a phase locked loop (PLL) circuit. A second approach involves using a delay locked loop (DLL) circuit.

The operation of a PLL synchronizing circuit will be explained below with reference to FIG. 1. The PLL circuit shown in FIG. 1 comprises a phase detector 12, a loop filter 14, and a voltage controlled oscillator 16. When external system clock CLK and internal clock PCLK are applied to phase detector 12, it detects the phase difference and supplies a phase difference detection signal to loop filter 14. Loop filter 14 is a low-pass filter which generates a direct current control voltage V(t) by filtering the phase difference detection signal. Loop filter 14 supplies control voltage V(t) to voltage controlled oscillator 16 connected, in turn, to the output port. Voltage controlled oscillator 16 generates internal clock PCLK having a frequency corresponding to the level of control voltage V(t) output from loop filter 14.

Consequently, if the phase difference between external system clock CLK and internal clock PCLK has a positive value, control voltage V(t) is increased. By doing so, the cycle of internal clock PCLK output from voltage controlled oscillator 16 is reduced, and thus the phase difference between external system clock CLK and internal clock PCLK is reduced. On the other hand, if the phase difference between the external clock CLK and internal clock PCLK has a negative value, control voltage V(t) is decreased resulting in an increase in the cycle of internal clock PCLK output from voltage controlled oscillator 16 and a decrease in the phase difference between external system clock CLK and internal clock PCLK.

The operation of a DLL synchronizing circuit is similar to that described above. In the case of a DLL circuit, voltage controlled oscillator 16 is replaced by a voltage controlled delay circuit. The delay produced by the voltage controlled delay circuit varies according to control voltage V(t).

Using PLL and DLL synchronizing circuits to synchronize an internal clock signal to an external clock signal has several drawbacks. The locking time, i.e., the time required to synchronize the internal clock PCLK with the external system clock CLK, is long. Increased locking time results in increased data access time, and thus, slower acquisition times. Additionally, the synchronizing circuit must be operated at all times and during all device states, including standby, increasing the standby current and the consequent power consumption.

Another approach to reduce clock skew between an external and an internal clock signal is to employ a voltage controlled delay line. The circuit typical of this approach is the synchronous delay line (SDL) disclosed in U.S. Pat. No. 4,975,605 entitled SYNCHRONOUS DELAY LINE WITH AUTOMATIC RESET to Mel Bazes, issued Dec. 4, 1990. Typical improvements on the synchronous delay line circuit are the synchronous mirror delay (SMD) and a hierarchical phase locking delay (HPLD) circuits employed in 256M DRAMs.

Use of an SMD circuit brings about the same result. The SMD circuit controls connections between forward mirror-shaped unit delays and backward unit delays only with a mirror-shaped control circuit including, for example, NAND gates, to thereby realize phase synchronization. Therefore, the SMD circuit, although overcoming variations dependent on temperature and process, lengthens the delay line of forward and backward mirror-shaped unit delays resulting in an increased layout area of the semiconductor chip.

Therefore a need remains for a circuit for synchronizing an internal clock signal to an external clock signal which reduces locking time, power consumption, and layout area.

SUMMARY OF THE INVENTION

The object of the present invention is to provide a phase locked delay circuit which reduces layout area while maintaining the characteristics of a conventional phase locked delay circuit using a synchronous delay line (SDL).

To achieve the above object, a phase locked delay circuit comprising a delay buffer, a main delay unit, a delay line, a phase synchronization detecting means, a switching unit, a flag signal generator, and a clock driver is provided.

The delay buffer receives the external system clock signal, delays the received signal for a predetermined first delay time, buffers the delayed signal, and outputs the buffered signal as a first clock signal.

The main delay unit receives the first clock signal in response to a flag signal and either delays the first clock signal for a predetermined second delay time or bypasses and outputs the first clock signal as a second clock signal;

The delay line includes a plurality of serially connected unit delays which receive the second clock signal, sequentially delay the second clock signal for a predetermined unit time, and output the delayed signals.

The phase synchronization detecting means includes a plurality of phase comparison detectors, each of the plurality of phase comparison detectors are controlled by the flag signal, receive the signal output by an output port of a corresponding unit delay and the first clock signal, compare the phase of the signal received from the unit delays with the phase of the first clock signal, activate a corresponding enable and carry signals only when the phases of the signals are identical, and output to the clock driver the activated enable and carry signals.

The flag signal generator outputs the flag signal responsive to the carry signals and a reset signal. The switching unit includes a plurality of switches, each switch of said plurality of switches provides a corresponding signal switched among from the signals delayed a output by the plurality of unit delays to a clock driver input responsive to a corresponding switch enable signal output by the phase synchronization detecting means.

The clock driver receives the switched signal from the switching unit, delays the received signal for a predetermined fourth delay time, and outputs the delayed signal as an internal clock signal.

In the phase locked delay circuit, the states of the enable signals are maintained when the first clock signal is bypassed in the main delay.

By doing as described above, the present invention reduces the layout area of the phase locked delay circuit.

BRIEF DESCRIPTION OF THE DRAWINGS

The above object and advantages of the present invention will become more apparent by describing in detail a preferred embodiment thereof with reference to the attached drawings in which:

FIG. 11 is a signal timing diagram for the circuits illustrated in the block diagram of FIG. 10.

DESCRIPTION OF THE PREFERRED EMBODIMENTS

Figure 1:
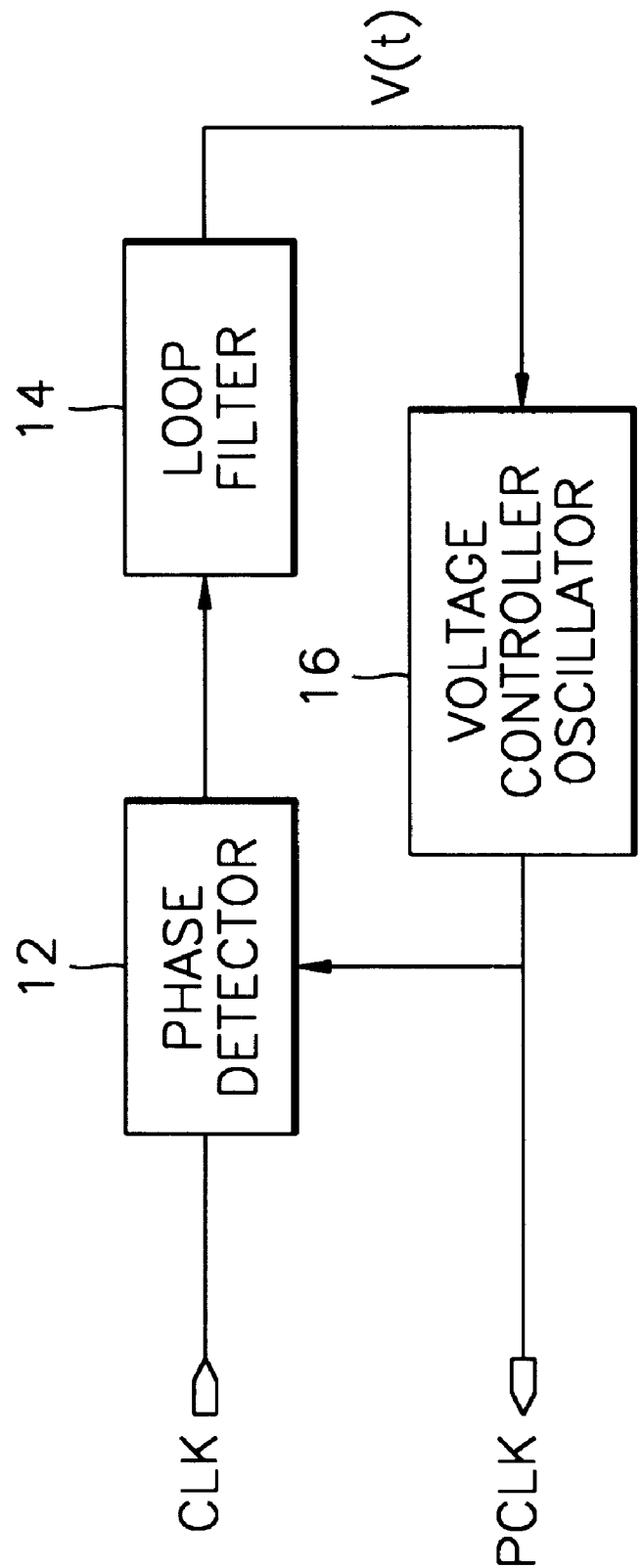
FIG. 1 is a block diagram of a conventional clock synchronizing circuit using a phase locked loop (PLL)
Figure 2:
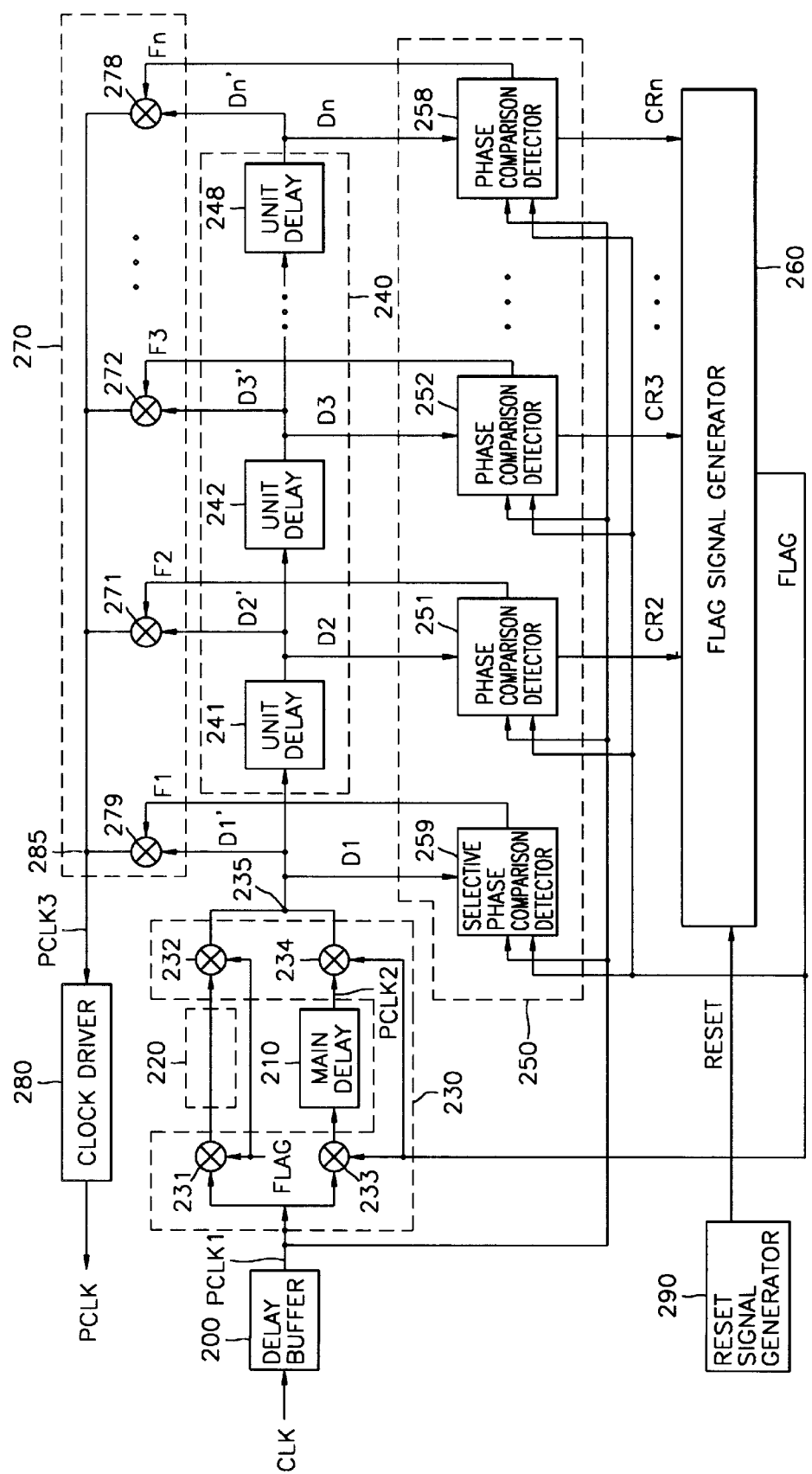
FIG. 2 is a block diagram of an embodiment of a phase locked delay circuit according to the present invention.

Referring to FIG. 2, an embodiment of the phase locked delay circuit according to the present invention includes a delay buffer 200, a main delay 210, a bypass path 220, switching units 230 and 270, a delay line 240, a phase synchronization detection unit 250, a flag signal generator 260, a clock driver 280, and a reset signal generator 290.

Delay buffer 200 receives external system clock signal CLK, delays the external system clock signal CLK for a first predetermined delay time d1, buffers the delayed signal, and outputs the buffered signal as clock signal PCLK1. Clock signal PCLK1 has the same cycle period tCC as that of external system clock signal CLK.

Main buffer 210 receives clock signal PCLK1, delays clock signal PCLK1 for a second predetermined delay time d2, and outputs the delayed signal as clock signal PCLK2.

Bypass path 220 bypasses clock signal PCLK1.

Switching unit 230 is controlled by flag signal FLAG and selects between bypass path 220 and main delay 210 to thereby connect delay buffer 200 to node 235. Switching unit 230 includes switches 231-234. Switch 231 is connected between an output port of delay buffer 200 and an input port of bypass path 220. Switch 231 is enabled when flag signal FLAG is active such that clock signal PCLK1, output by delay buffer 200, is transmitted through bypass path 220. Switch 232 is connected between an output port of bypass path 220 and node 235. Switch 232 is enabled when the flag signal FLAG is active such that clock signal PCLK1, transmitted through bypass path 220, is sent to node 235. Switch 233 is connected between an output port of delay buffer 200 and an input port of main delay 210. Switch 233 is enabled when the flag signal FLAG is inactive such that the clock signal PCLK1, output by delay buffer 200, is sent to main delay 210. Switch 234 is connected between an output port of main delay 210 and node 235. Switch 234 is enabled when flag signal FLAG is inactive such that clock signal PCLK2, output by main delay 210, is sent to node 235.

Delay line 240 outputs signals D2–Dn and D2'–Dn'. Signals D2–Dn result from sequentially delaying clock signal PCLK2 transmitted to node 235 for a unit delay time dt. Signals D2'–Dn' result from sequentially delaying clock signal PCLK1 transmitted to node 235 for unit delay time dt.

Delay line 240 includes a plurality of serially connected unit delays 241–248 connected in series. Unit delays 241–248 sequentially delay clock signal PCLK1 received from node 235 through bypass path 220 for a unit delay time dt. Unit delays 241–248 also sequentially delay clock signal PCLK2 received from node 235 through main delay 210 for the unit delay time dt. Unit delays 241–248 output the delayed signals. That is, unit delay 241 delays clock signal PCLK2 transmitted to node 235 for unit delay time dt when flag signal FLAG is inactive. Unit delay 242 receives signal D2 output by unit delay 241 when signal FLAG is inactive, delays the received signal D2 for the unit delay time dt, and outputs the delayed signal as signal D3. Similarly, unit delay 248 receives the signal output by the preceding unit delay when signal FLAG is inactive and delays the received signal for the unit delay time dt. In addition, unit delay 241 delays clock signal PCLK1 transmitted to node 235 when signal FLAG is active, and outputs the delayed signal as D2'. Unit delay 242 receives D2' signal output by the unit delay 241 when signal FLAG is active, delays signal D2', and outputs the delayed signal as signal D3'. Similarly, the unit delay 248 receives the signal output by the preceding unit delay when signal FLAG is active, delays the received signal for the unit delay time dt, and outputs the delayed signal as Dn'.

Reset signal generator 290 generates a reset signal RESET for resetting, where necessary, the operation of synchronizing an internal clock signal PCLK with external system clock signal CLK. Reset signal RESET is a pulse signal which becomes inactive once internal clock signal PCLK synchronized with external system clock signal CLK is generated. Therefore, internal clock signal PCLK is continuously generated while reset signal RESET is inactive, being synchronized with external system clock signal CLK and keeping its state.

Phase synchronization detection unit 250 serves to detect the other periods except for the delay time t1 from the cycle period tCC of external system clock signal CLK. That is, phase synchronization detection unit 250 detects a delay time t2 required to synchronize the clock signal PCLK2 with clock signal PCLK1.

Phase synchronization detection unit 250 includes a selective phase comparison detector 259 and a plurality of phase comparison detectors 251–258. Phase synchronization detection unit 250 compares the phases of signals D1–Dn with the phase of clock signal PCLK1 and compares the phases of clock signals PCLK2 and PCLK1.

The plurality of phase comparison detectors 251–258, each of which is enabled only when signal FLAG is inactive, receive clock signal PCLK1 and signals D2 through Dn output by the corresponding one of the plurality of unit delays 241–248. Phase comparison detectors 251–258 compare the phases of signals D2 through Dn with the phase of clock signal PCLK1 activating a corresponding enable signal at the first coincidence between these phases. That is, phase comparison detector 251 is enabled only when signal FLAG is inactive, receives clock signal PCLK1 and signal D2 output by the unit delay 241, compares the phases of PCLK1 and D2, and activates a corresponding enable signal only when the phases of PCLK1 and D2 are identical. Phase comparison detector 252 is enabled only when signal FLAG is inactive, receives clock signal PCLK1 and signal D3 output by the unit delay 242, compares their phases, and activates a corresponding enable signal only when the phases of PCLK1 and D3 are identical. Phase comparison detector 258 functions similarly to activate a corresponding enable signal Fn when the phase of signal Dn and clock signal PCLK1 is identical. Therefore, only one enable signal corresponding to the first coincidence between signals D2–Dn and clock signal PCLK1 is activated. All other enable signals are inactive after the first enable signal is active.

Selective phase comparison detector 259 operates according to user selection. Selective phase comparison detector 259 outputs clock signal PCLK1 as clock signal PCLK3 when the period of external system clock signal CLK is longer than the delay time in unit delays 241–248 by activating enable signal F1 to switch 279.

Flag signal generator 260 is enabled by the reset signal RESET, receives carry signals CR2–CRn output by phase comparison detectors 251–258, outputs a signal FLAG which is active only when one of carry signals CR2–CRn is active.

Switching unit 270 includes a plurality of switches 271–279. Each of the plurality of switches 271–279 is enabled by corresponding enable signal F1–Fn, selects signals D1'–Dn' provided at node 235 by unit delays 241–248, and outputs signals D1'–Dn' as clock signal PCLK3.

Clock driver 280 receives clock signal PCLK3, delays the received signal for a delay time d2, and outputs the delayed signal as internal clock signal PCLK.

As shown in FIG. 2, the present invention includes a single delay line 240 having unit delays 241–248, instead of two delay lines found in conventional technology. Thus, the layout area of the chip is reduced.

Figure 3:
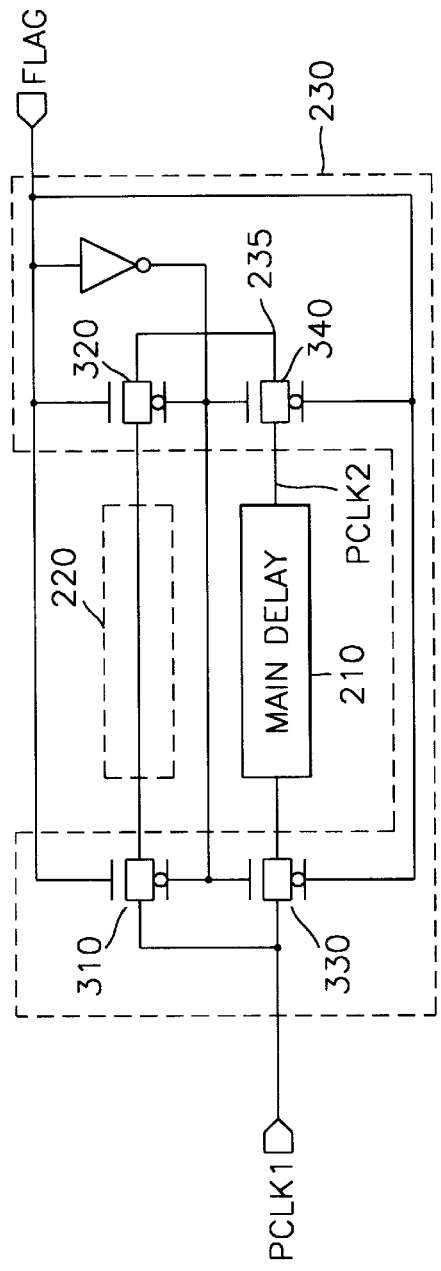
FIG. 3 is a circuit diagram of switching unit 230 shown in FIG. 2.

FIG. 3 is a circuit diagram of switching unit 230 shown in FIG. 2. Switching unit 230 includes transmission gates 310–340. Transmission gate 310 is connected between the output port of delay buffer 200 and the input port of bypass path 220. Transmission gate 310 conducts when signal FLAG is at a logic high level transmitting clock signal PCLK1 output by delay buffer 200 to bypass path 220.

Transmission gate 320 is connected between the output port of bypass path 220 and node 235. Transmission gate 320 conduct when signal FLAG is at a logic high level, sending clock signal PCLK1 transmitted through bypass path 220 to node 235.

Transmission gate 330 is connected between the output port of delay buffer 200 and the input port of main delay 210. Transmission gate 330 conducts when signal FLAG is at a logic low level, and sending clock signal PCLK1 output by delay buffer 200 to main delay 210.

Transmission gate 340 is connected between the output port of main delay 210 and node 235. Transmission gate 340 conducts when signal FLAG is at a logic low level, sending clock signal PCLK2 output by main delay 210 to node 235.

Figure 4:
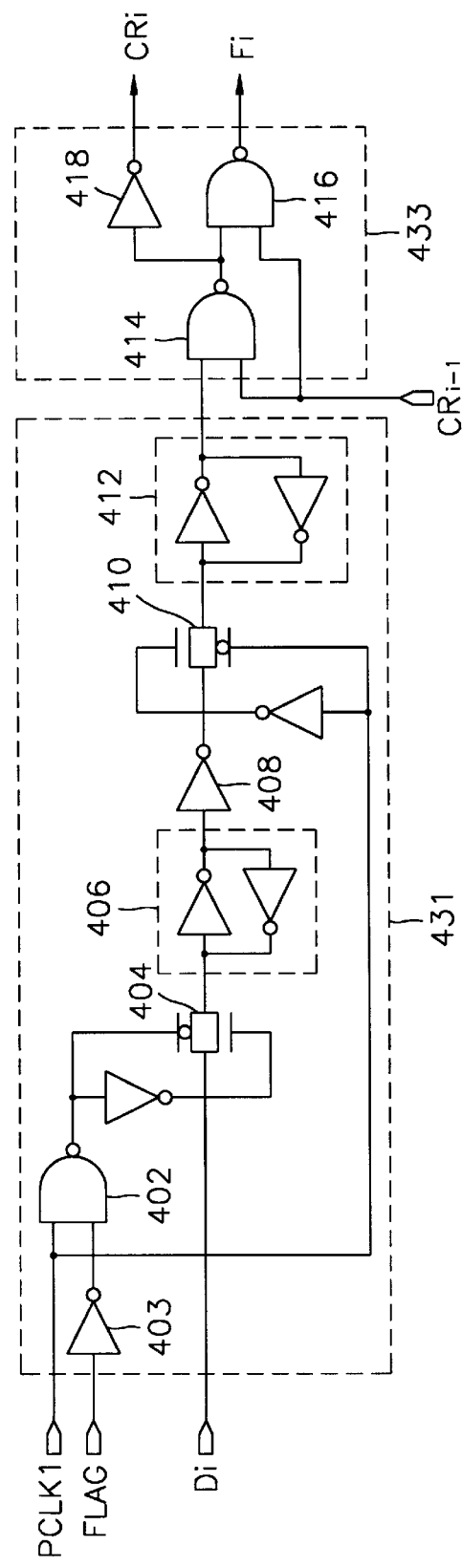
FIG. 4 is a circuit diagram of phase comparison detector 250 shown in FIG. 2.

FIG. 4 is a circuit diagram of phase comparison detectors 251–258 shown in FIG. 2. Referring to FIG. 4, each of phase comparison detectors 251–258 includes phase comparator 431 and carry/enable signal generator 433.

Phase comparator 431 includes NAND gate 402, inverters 401 and 408, transmission gates 404 and 410, and latches 406 and 412.

Inverter 401 inverts signal FLAG. NAND gate 402 receives clock signal PCLK1 and the signal output by inverter 401, and outputs a signal which is set to a logic low only when clock signal PCLK1 is at a logic high and signal FLAG is at a logic low.

Transmission gate 404 is controlled by the signal output by NAND gate 402. That is, transmission gate 404 conducts only when the signal output by NAND gate 402 is at a logic low, providing the corresponding signal among signals Di, where i is equal to 2 through n, to latch 406.

Latch 406 receives the signal output from transmission gate 404, latches the received signal, and outputs its inverted signal.

Inverter 408 receives the signal latched by latch 406 and inverts the received signal.

Transmission gate 410 is controlled by clock signal PCLK1, that is, it conducts only when clock signal PCLK1 is at a logic low, receives a signal output by inverter 408, and transmits the received signal to latch 412.

Latch 412 receives the signal output by transmission gate 410 and latches the received signal.

Carry/enable signal generator 433 includes NAND gates 414 and 416 and an inverter 418.

NAND gate 414 receives the signal output by latch 412 and carry signal $CR_{i-1}$, output by the preceding phase comparison detector and outputs a signal which is set to a logic low only when the received signals are at a logic high.

Inverter 418 receives a signal output by NAND gate 414, inverts the received signal, and outputs the inverted signal as carry signal $CR_i$.

NAND gate 416 receives the signal output by NAND gate 414 and carry signal $CR_{i-1}$. NAND gate 416 outputs a logic low Fi signal when the received signals are at a logic high level. Thus, enable signal Fi is at a logic low when the signal output from latch 412 is at a logic low. When clock signal PCLK1 is at a logic high, signal FLAG is at a logic low, signal Di input to transmission gate 404 is at a logic high, and carry signal $CR_{i-1}$ is at a logic high, enable signal Fi is at a logic low. Enable signal Fi is an active low signal.

Referring to FIG. 4, phase comparison detectors 251–258 of FIG. 2 are enabled only when signal FLAG is at a low level. Phase comparison detectors 251–258 compare the phases of clock signal PCLK1 with the phases of corresponding signals Di and determine whether they are identical.

Table 1 is a truth table of enable signal Fi and carry signal $CR_i$ according to signal Di and preceding carry signal $CR_{i-1}$, when signal FLAG is at a logic low and clock signal PCLK1 is at a logic high.

TABLE 1

| $CR_{i-1}$ | Di | $CR_i$ | Fi |
|---|---|---|---|
| 0 | 0 | 0 | 1 |
| 0 | 1 | 0 | 1 |
| 1 | 0 | 1 | 1 |
| 1 | 1 | 0 | 0 |

Phase comparison detectors 251–258 receive signal Di only when clock signal PCLK1 is at a logic high and signal FLAG is at a logic low level. Carry/enable signal generator 43 output a logic low enable signal Fi when the preceding carry signal $CR_{i-1}$ is at a logic high and the phase of clock signal PCLK1 is identical to that of signal Di. In the case where signal FLAG is at a logic high, transmission gate 404 always turns off, maintaining the states of the signals latched in latches 406 and 412. The result is that enable signal Fi does not change states.

Figure 5:
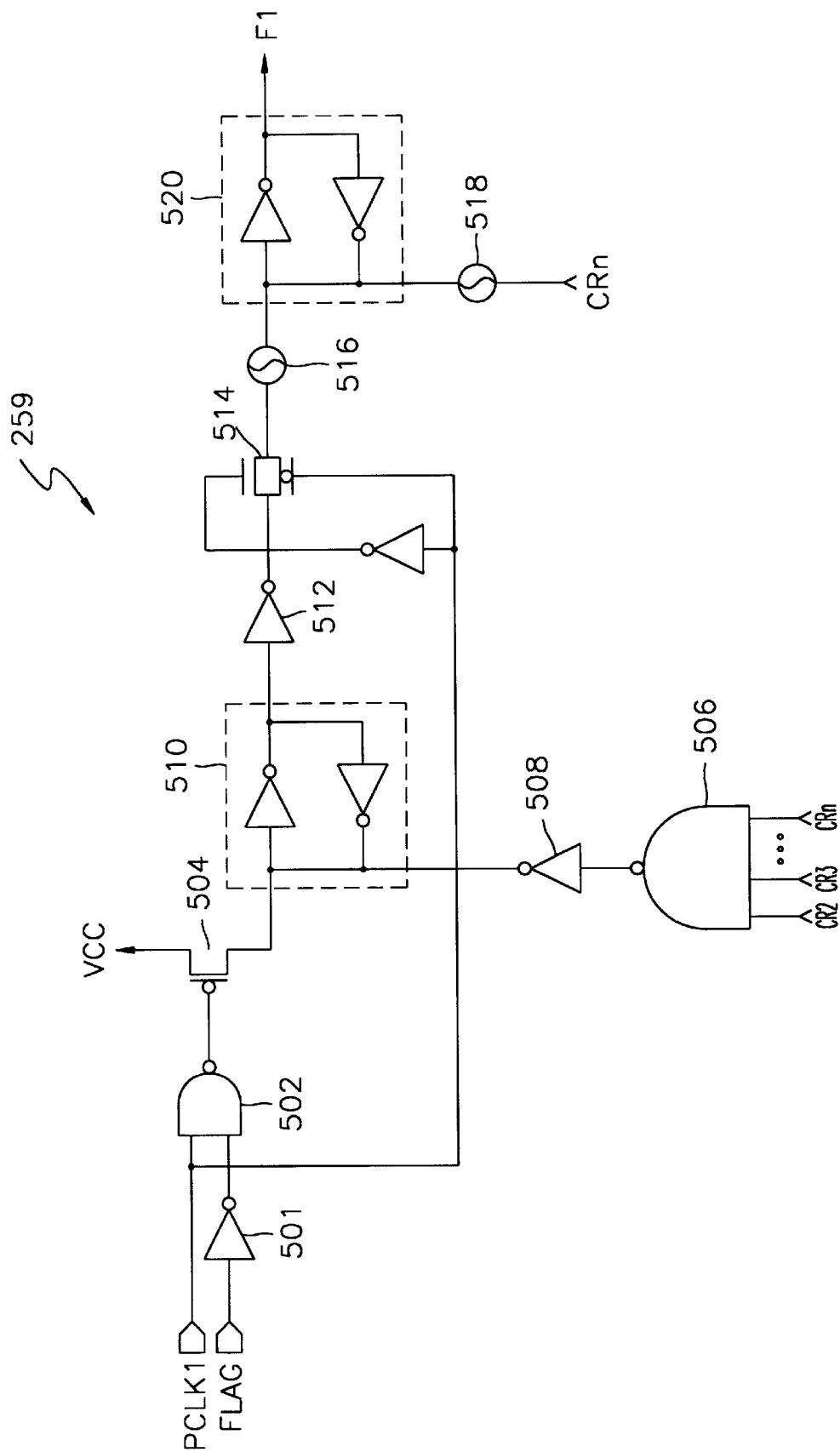
FIG. 5 is a circuit diagram of selective phase comparison detector 259 shown in FIG. 2.

FIG. 5 is a circuit diagram of selective phase comparison detector 259 shown in FIG. 2.

Selective phase comparison detector 259 includes fuses 516 and 518, PMOS transistor 504, NAND gates 502 and 506, inverters 501, 508, and 512, transmission gate 514, and latches 510 and 520.

Selective phase comparison detector 259 is enabled or disabled by selectively connecting or disconnecting fuses 516 and 518. That is, fuses 516 and 518 are connected when the period of external system clock signal CLK is longer than the total delay time in the delay line 240.

The other elements comprising selective phase comparator 259 will be described for the case where fuses 516 and 518 are connected.

Inverter 501 inverts signal FLAG. NAND gate 502 receives clock signal PCLK1 and inverted signal FLAG output from inverter 501, and outputs a signal which becomes low when clock signal PCLK1 is at a logic high and signal FLAG is at a low.

PMOS transistor 504 has a gate, a source, and a drain terminal. PMOS transistor 504 is gated by the output of NAND gate 502, sending a voltage source VCC to a drain terminal only when the output of NAND gate 502 is at a logic low.

NAND gate 506 receives carry signals CR2–CRn output by phase comparison detectors 251–258 and outputs a logic low signal when carry signals CR2–CRn are all at a logic high.

Inverter 508 receives the signal output by NAND gate 506 and inverters the received signal.

Latch 510 latches a logic high signal received by PMOS transistor 504, receives the signal output by inverter 508, latches the received signal, and inverts the latched signal. Inverter 512 receives the signal output by latch 510 and inverts the received signal. Transmission gate 514 is controlled by clock signal PCLK1. Thus, transmission gate 514 conducts when clock signal PCLK1 is at a logic low providing the output of inverter 512 to the input of latch 520.

Latch 520 either receives the signal output by transmission gate 514 or a carry signal CRn depending on whether fuses 516 and 518 are connected. Latch 520 latches the received signal and outputs an inverted version of the latched signal as enable signal F1.

If the period of external system clock signal CLK is longer than the total delay time in the delay line 240, the carry signals CR2–CRn output by phase comparison detectors 251–258 of FIG. 2 are all at a logic high level resulting in a logic low enable signal F1 output by selective phase comparison detector 259. Enable signal F1 is an active low signal.

If the period of external system clock signal CLK is shorter than the total delay time in the delay line 240, one of enable signals F2–Fn output by phase comparison detectors 251–258 of FIG. 2 is at a logic low and a corresponding carry signal is at a logic low. If this condition occurs, enable signal F1 is deactivated at a logic high.

Figure 6:
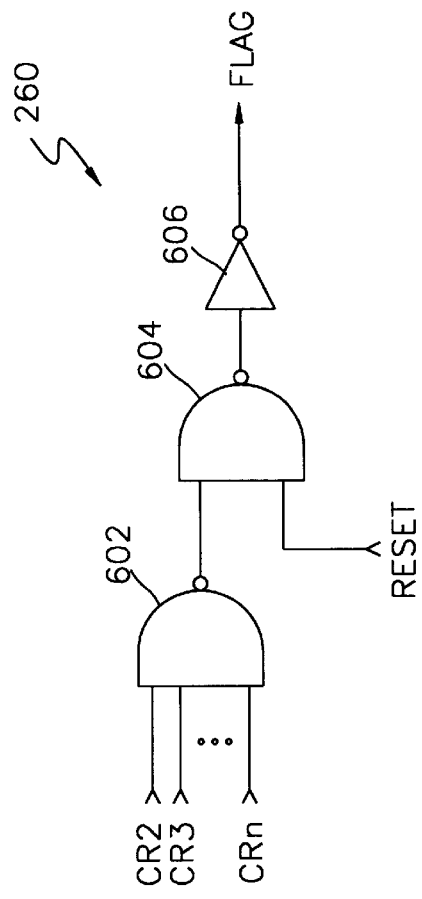
FIG. 6 is a circuit diagram of flag signal generator 260 shown in FIG. 2.

FIG. 6 is a circuit diagram of flag signal generator 260 shown in FIG. 2. Flag signal generator 260 includes NAND gates 602 and 604 and an inverter 606. NAND gate 602 receives carry signals CR2–CRn output by phase comparison detectors 251–258 and outputs an active low signal when all the carry signals CR2–CRn are at a logic high.

NAND gate 604 receives the signal output by NAND gate 602 and the reset signal RESET and outputs an active low signal when the received signals are all at a logic high.

Inverter 606 inverts the output of NAND gate 604 and outputs signal FLAG.

Flag signal generator 260 of FIG. 6 outputs a flag signal FLAG. Signal FLAG is at a logic high if the reset signal RESET is at a logic high and one of the carry signals CR2–CRn is at a logic low. That is, flag signal generator 260 outputs a logic high signal FLAG when the delay time t2 required for synchronizing clock signal PCLK2 with clock signal PCLK1 is detected.

Figure 7:
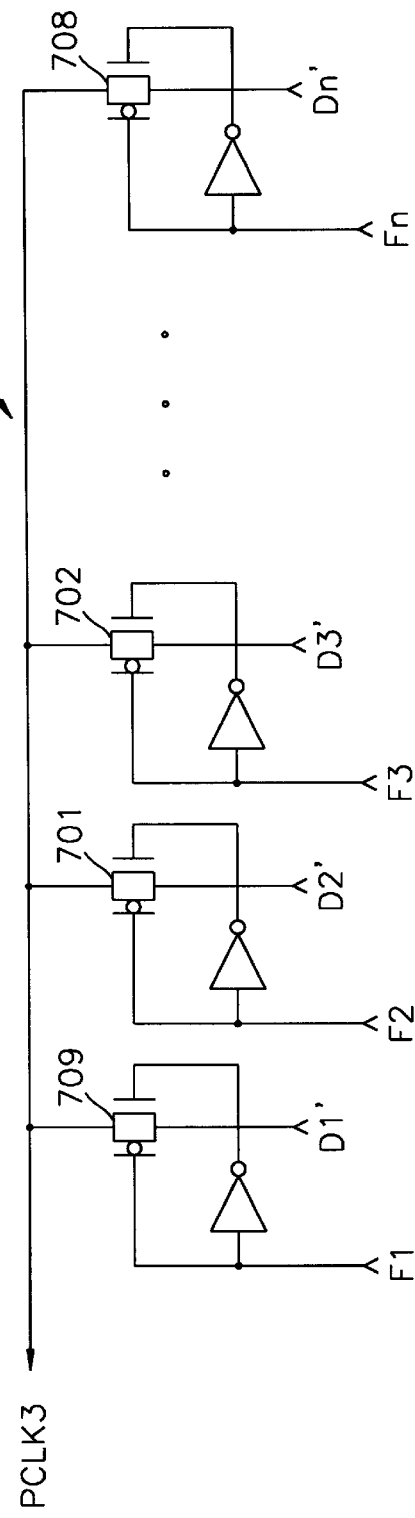
FIG. 7 is a circuit diagram of switching unit 270 shown in FIG. 2.

FIG. 7 is a circuit diagram of switching unit 270 shown in FIG. 2. Switching unit 270 is provided with transmission gates 701–709 which constitute plurality of switches 271–279 shown in FIG. 2, respectively.

Each of transmission gates 701–709 conducts in response to corresponding enable signals F1–Fn and outputs a corresponding D1'–Dn' signal as clock signal PCLK3.

Figure 8:
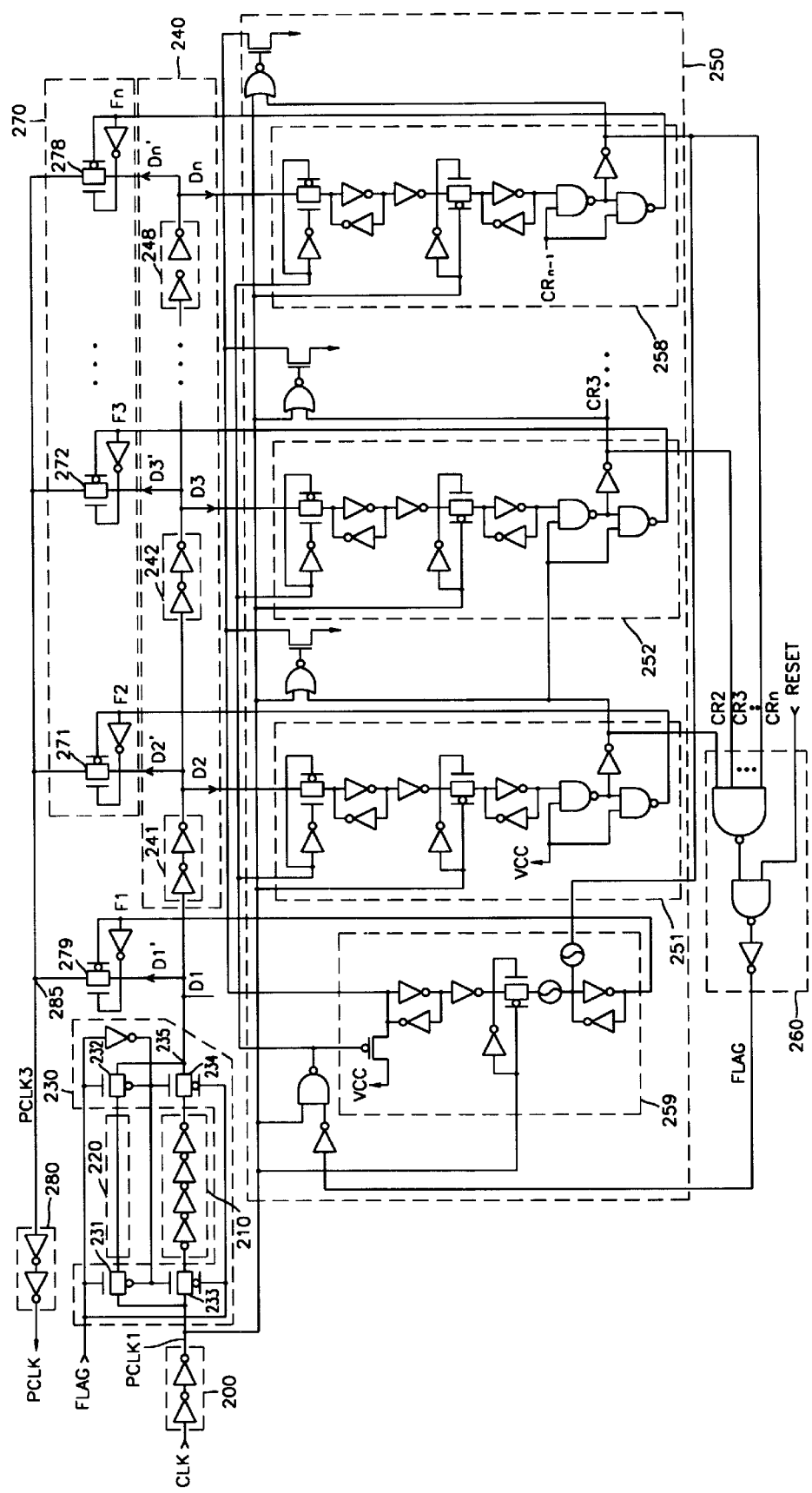
FIG. 8 is a detailed circuit diagram of FIG. 2.

FIG. 8 is a detailed circuit diagram of FIG. 2 employing the circuits of FIGS. 3 through 7. Here, the same reference numerals as those in FIG. 2 are used for each block shown in FIG. 8. Also, each block in FIG. 8 is described in detail with reference to the descriptions associated with FIGS. 3–7. The operation of the circuit in FIGS. 2 and 8 is best described with reference to FIG. 9.

Figure 9:
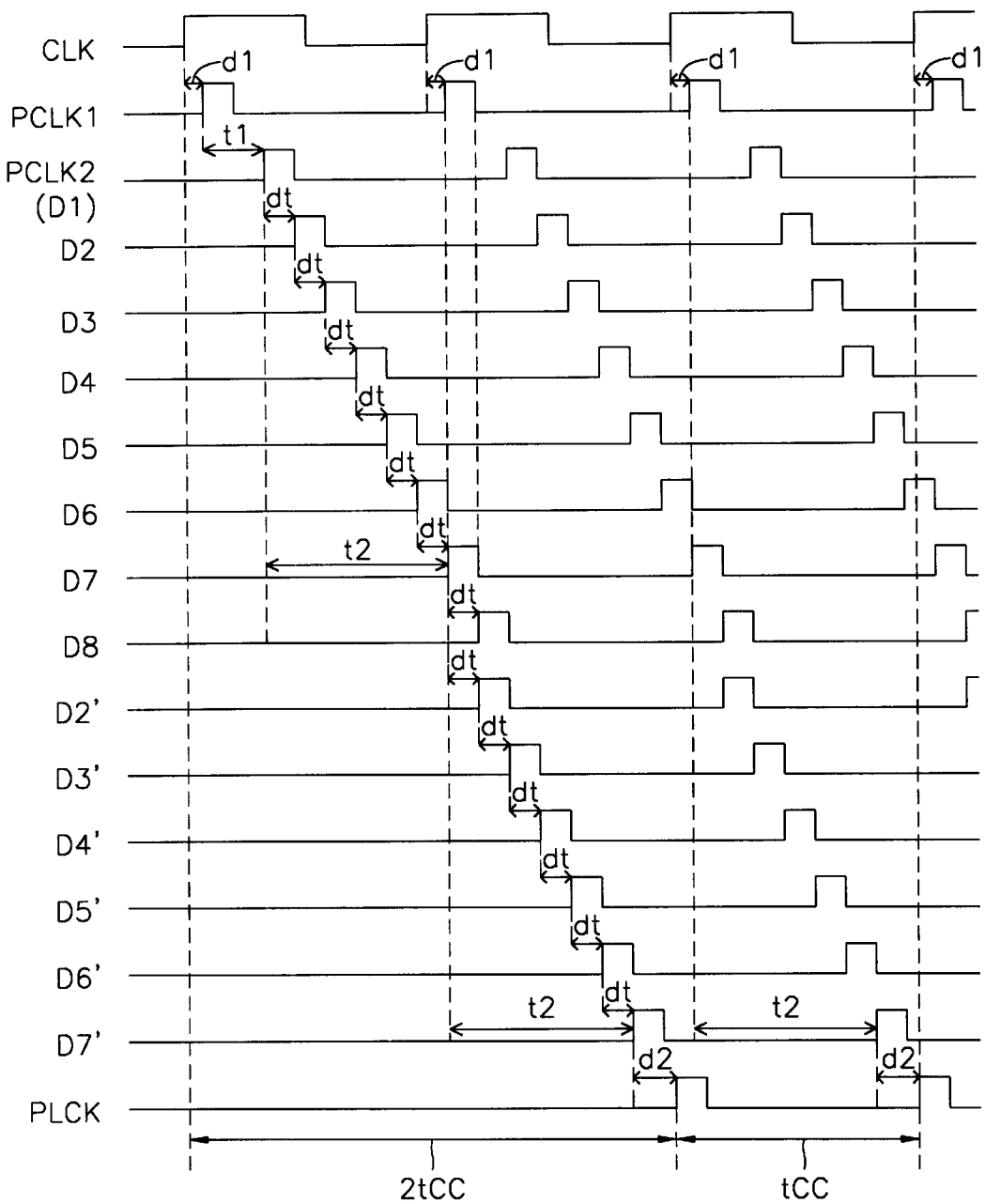
FIG. 9 is a timing diagram for the circuit shown in FIGS. 2 and 8.

FIG. 9 is a timing diagram of the various signals shown in FIG. 8. Delay buffer 200 delays external system clock signal CLK for a delay time d1, buffers the delayed signal, and outputs the buffered signals as clock signal PCLK1 (see the timing diagram of PCLK1 in FIG. 9). Clock signal PCLK1 has the same period tCC as that of external system clock signal CLK.

Reset signal RESET is active at a logic low and then inactive at a logic high when the operation of the semiconductor device needs to be synchronized with external system clock signal CLK. If reset signal RESET is at a logic low, flag signal generator 260 outputs a logic low signal FLAG.

Transmission gates 233 and 234 in switching unit 230 conduct when signal FLAG is at a logic low. Then, clock signal PCLK1 output by delay buffer 200 is delayed by delay time t1 in main delay 210, and output as clock signal PCLK2 (see the timing diagram of PCLK2 in FIG. 9).

Signals D2–Dn are input to phase comparison detectors 251–258. Phase comparison detectors 251–258 are also enabled by an active low signal FLAG. Phase comparison detectors 251–258 receive corresponding signals D2–Dn and clock signal PCLK1, compare the phases of signals D2–Dn with the phase of clock signal PCLK1, and output corresponding logic high enable signals F1–Fn and corresponding carry signals if the phases of enable signals D2–Dn and clock signal PCLK1 are different. Phase comparison detectors 251–258 receive corresponding signals D2–Dn and clock signal PCLK1, compare the phases of signals D2–Dn with the phase of clock signal PCLK1, and output corresponding logic low enable signals F1–Fn and corresponding carry signals if the phases of signals D2–Dn and clock signal PCLK1 are identical.

After a logic low enable signal is output by one of phase comparison detectors 251–258, other phase comparison detectors output logic high enable signals and corresponding carry signals.

If the period of external system clock signal CLK is longer than the total delay time in the unit delays 241–248, that is, if any of the phases of signals D2–Dn is not identical to that of clock signal PCLK1, all corresponding enable signals F2–Fn output by phase comparison detectors 251–258 are at a logic high. When this happens, a logic low enable signal F1 is output by the selective phase comparison detector 259 and clock signal PCLK1 is output as clock signal PCLK3 to node 285 through transmission gate 279.

As shown in FIG. 9, a corresponding enable signal, for example F7, is at a logic low when the phase of signal D7 is identical to that of clock signal PCLK1 (see the timing diagrams of D2–D8 in FIG. 9). Under these conditions, signal FLAG is at a logic high, and stays high until signal FLAG is deactivated at a low by the reset signal RESET.

Clock signal PCLK1 is sent to node 235 through bypass path 220 responsive to a logic high signal FLAG, delayed for unit delay time dt in unit delays 241–248, and output as signals D2'–Dn' from the output ports of unit delays 241–248 (see the timing diagrams of D2'–Dn' in FIG. 9).

Since selective phase comparison detector 259 and phase comparison detectors 251–258 are disabled by a logic high signal FLAG, the states of enable signals F1–Fn are not changed during this period. Only the transmission gate receiving a logic low enable signal, for example F7, turns on, and a corresponding signal, for example D7', is output as clock signal PCLK3 to node 235.

Clock signal PCLK3 is delayed for delay time d2 through clock driver 280 and output as internal clock signal PCLK (see the timing diagram of PCLK in FIG. 9).

As noted in the timing diagrams of FIG. 9, delay time d2 required to transmit a signal from node 235 through unit delays 241–248 to node 285 is the time obtained by subtracting delay time t1 of main delay 210 from the period tCC of external system clock signal CLK, that is, tCC−t1. In addition, the period from the input of external system clock signal CLK to delay buffer 200 to generation of internal clock signal PCLK firstly synchronized with external system clock signal CLK is twice as long as the period of external system clock signal CLK, that is, 2tCC. Accordingly, internal clock signal PCLK is synchronized with external system clock signal CLK at every cycle of external system clock signal CLK.

Figure 10:
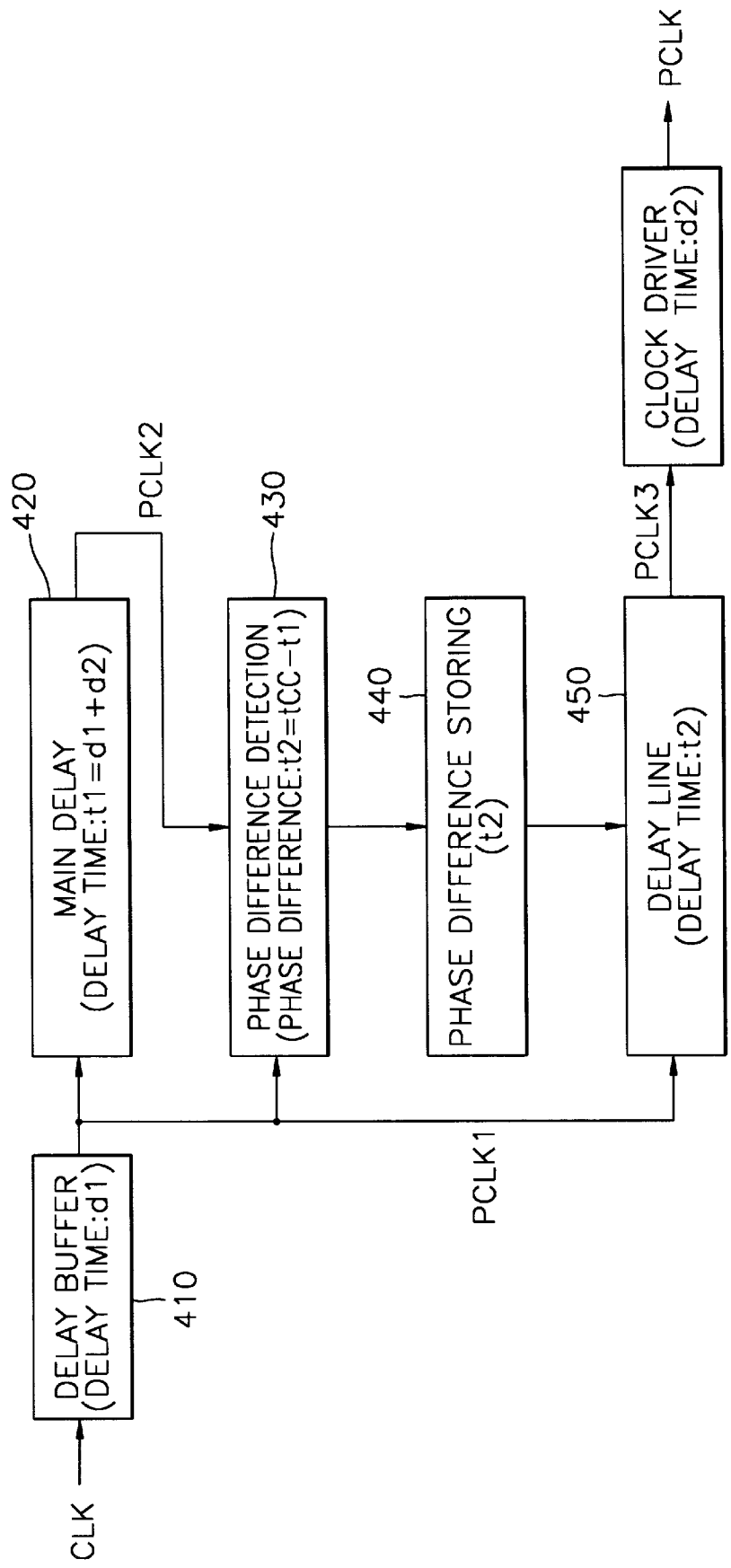
FIG. 10 is a block diagram illustrating the method of generating a synchronized internal clock signal in the circuit of FIG. 8.

FIG. 10 conceptually illustrates the procedure of generating a synchronized internal clock signal PCLK from external system clock signal CLK in the circuit of FIGS. 2 or 8.

FIG. 11 is a timing diagram of clock signals PCLK1, PCLK2, and PCLK3 for showing the procedure of generating a synchronized internal clock signal PCLK from external system clock signal CLK in the circuit of FIGS. 2 or 8.

Referring to FIGS. 10 and 11, delay buffer 200 receives external system clock signal CLK, delays external system clock signal CLK for the predetermined delay time d1, buffers the delayed system clock signal, and outputs the buffered signal as clock signal PCLK1.

Main delay 210 receives clock signal PCLK1, delays the received signal PCLK1 for the predetermined delay time t1, and outputs the delayed signal as clock signal PCLK2. Delay time t1 is the sum of the predetermined delay times d1 and d2.

When clock signal PCLK2 output by main delay 210 is sequentially delayed for the predetermined delay time dt through delay line 240 and output as signals D2–Dn, phase comparison detectors 251–258 compare the phases of signals D2–D9 with the phase of clock signal PCLK1 and activate a corresponding enable signal at the first coincidence between the phases of signals D2–D9 and the phase of clock signal PCLK1. That is, phase comparison detectors 251–258 detect delay time t2 required for synchronizing clock signal PCLK2 with clock signal PCLK1.

Delay line 240 delays clock signal PCLK1 for delay time t2 detected and stored by phase comparison detectors 251–258 and outputs the delayed signal as clock signal PCLK3.

Clock driver 280 delays clock signal PCLK3 for the predetermined delay time d2 and outputs the delayed signal as internal clock signal PCLK.

As shown in FIGS. 10 and 11, the total delay time required from input of external system clock signal CLK to output of internal clock signal CLK firstly synchronized with external system clock signal CLK is as long as that required in conventional phase locked delay.

$$\begin{aligned}\text{the total time} &= d1 + t1 + t2 + t2 + d2 \\ &= d1 + t1 + (tCC - t1) + (tCC - t1) + d2 \\ &= d1 + 2tCC - t1 + d2 \\ &= d1 + 2tCC - (d1 + d2) + d2 \\ &= 2tCC\end{aligned}$$

After internal clock PCLK is firstly synchronized with external system clock signal CLK, internal clock signal CLK synchronized with external system clock signal CLK is generated at every cycle period tCC of external system clock signal CLK.

Therefore, constraints imposed on a layout area by the external system clock signal of a long cycle period are overcome by using a single delay line to synchronize the internal clock signal with the external system clock.

The layout area of a semiconductor chip is reduced because the present invention includes a single delay line for delaying an input signal for a predetermined unit time and outputting the delayed signal.

The present invention is not limited to the above embodiment, and it is clearly understood that many variations are possible within the scope and spirit of the present invention by anyone skilled in the art.

What is claimed is:

1. A phase locked delay circuit for generating an internal clock signal synchronized with an external system clock signal, the circuit comprising:

a delay buffer for receiving the external system clock signal, delaying the external system clock for a predetermined first delay time, and outputting the delayed clock signal as a first clock signal;

a main delay unit coupled to said delay buffer for providing the first clock signal a main delay unit output node responsive to a flag signal being in a first state and for generating a second clock signal by delaying the first clock signal for a predetermined second delay time and providing the second clock signal to the main delay unit output node responsive to the flag signal being in a second state;

a delay line coupled to said main delay unit including a plurality of serially connected unit delays for generating a plurality of sequentially delayed clock signals by receiving either the first or the second clock signal from said main delay unit and sequentially delaying the received signal for a predetermined unit time;

means for detecting phase synchronization by comparing a phase of each of the sequentially delayed clock signals with a phase of the first clock signal responsive to the flag signal, generating a corresponding plurality of enable and carry signals, and activating an enable signal and a carry signal corresponding to one of the sequentially delayed clock signals in substantial phase with the first clock signal;

a flag signal generator for generating the flag signal responsive to the plurality of carry signals and a reset signal;

a switching unit coupled to said delay line including a plurality of switches for selecting one of the sequentially delayed signals responsive to the active enable signal; and a clock driver for receiving the signal selected by said switching unit, generating the internal clock signal by delaying the received signal for a predetermined third delay time.

2. The phase locked delay circuit of claim 1 wherein said main delay unit comprises:

a main delay for delaying the first clock signal for the predetermined second delay time and providing the second clock signal to the main delay unit output node;

a bypass path for bypassing said main delay and providing the first clock signal to the main delay unit output node; and main delay switching means for selecting either the main delay or the bypass path responsive to the flag signal.

3. The phase locked delay circuit of claim 2 wherein said main delay switching means comprises:

a first switching device connected between said delay buffer and said main delay for providing the first clock signal to said main delay responsive to the flag signal;

a second switching device connected between said main delay and said delay line for providing the second clock signal to the main delay unit output node responsive to the flag signal;

a third switching device connected between said delay buffer and said bypass path for providing the first clock signal to said bypass path responsive to the flag signal; and a fourth switching device connected between said bypass path and said delay line for providing the first clock signal to the main delay unit output node responsive to the flag signal, said first and second switching devices being disabled when said third and fourth switching devices are enabled and said first and second switching devices being enabled when said third and fourth switching devices are disabled.

4. The phase locked delay circuit of claim 3 wherein said first, second, third, and fourth switching devices are transmission gates.

5. The phase locked delay circuit of claim 1 wherein each of the plurality of enable signals does not change states when the flag is in the first state.

6. The phase locked delay circuit of claim 1 wherein a phase difference between the first and second clock signals is equal to an external system clock period minus the first and second predetermined delay times.

7. The phase locked delay circuit of claim 1 wherein said flag signal generator generates the flag signal in the first state when the reset signal is in the first state and one of the carry signals is in the second state.

8. The phase locked delay circuit of claim 1 further comprising a reset signal generator for generating the reset signal, the reset signal being disabled once the internal clock is synchronized with the external system clock.

9. The phase locked delay circuit of claim 1 wherein the means for detecting phase synchronization includes a plurality of phase detectors, each of said plurality of phase detectors comprising:

a phase comparator for receiving a corresponding sequentially delayed clock signal, comparing the phase of the received sequentially delayed clock signal with the phase of the first clock signal, and generating a phase synchronization signal, the phase synchronization signal being enabled when the phase of the sequentially delayed clock signal is the same as the phase of the first clock signal responsive to the flag signal; and a carry/enable signal generator for generating a carry and an enable signal responsive to the phase synchronization signal.

10. The phase locked delay circuit of claim 9 wherein said phase comparator maintains a state of the phase synchronization signal when the flag signal is in the first state.

11. The phase locked delay circuit of claim 9 wherein said phase comparator comprises:

first switching means for transmitting the received sequentially delayed clock signal to a first switching means output node responsive to the flag and first clock signal;

a first latch coupled to said first switching means for generating a first latched signal by latching the signal transmitted to the first switching means output node;

an inverter coupled to said first latch for inverting the first latched signal;

second switching means coupled to said inverter for transmitting the inverted first latched signal to a second switching means output node responsive to the first clock signal; and a second latch coupled to said second switching means for generating the phase synchronization signal by latching the signal transmitted to the second switching means output node.

12. The phase locked delay circuit of claim 1 wherein said means for detecting phase synchronization comprises:

operation selecting means for selecting an operation according to user need; and a selective phase comparison detector for generating a first enable signal responsive to the selected operation of said operation selecting means.

13. A method of synchronizing an external clock signal to an internal clock signal in a semiconductor memory device, the method comprising:

generating a first clock signal by delaying the external system clock signal for a predetermined first delay time;

generating a second clock signal by delaying the first clock signal for a predetermined second delay time;

detecting a phase difference between the first and the second clock signals;

storing the detected phase difference between the first and the second clock signals;

delaying the first clock signal by a series of connected unit delays to produce a plurality of serially delayed first clock signals;

generating a third clock signal by selecting the delayed first clock signal of the plurality of serially delayed first clock signals having substantially the stored phase difference; and generating the internal clock signal synchronized to the external clock signal by delaying the third clock signal by the predetermined second delay time.

14. A method of synchronizing an external clock signal to an internal clock signal in a semiconductor memory device, the method comprising:

generating a first clock signal by delaying the external system clock signal for a predetermined first delay time;

generating a second clock signal by delaying the first clock signal for a predetermined second delay time;

detecting a phase difference between the first and the second clock signal including delaying the second clock signal by a series of connected unit delays to produce a plurality of serially delayed second clock signals and detecting a phase difference between the serially delayed second clock signals and the first clock signal;

storing the detected phase difference between the first and the second clock signal;

delaying the first clock signal by the series of connected unit delays to produce a plurality of serially delayed first clock signals;

generating a third clock signal by selecting the delayed second clock signal of the plurality of serially delayed second clock signals having substantially the stored phase difference; and generating the internal clock signal synchronized to the external clock signal by delaying the third clock signal by the predetermined second delay time.

15. The method of claim 14 wherein selecting the delayed second clock signal includes enabling at least one of a plurality of switches connected between the plurality of unit delays and a third clock signal line.

16. The method of claim 14 further including generating a flag signal responsive to a reset signal.

17. The method of claim 16 wherein generating the first clock signal is responsive to the flag signal and generating the second clock signal is responsive to the flag signal.

18. The method of claim 16 wherein generating a second clock signal includes applying the first clock signal to a main delay unit when the flag signal is in a first state to thereby delay the first clock signal by the second predetermined delay time and produce a second clock signal at a main delay unit output node.

19. The method of claim 18 wherein generating a first clock signal includes bypassing the main delay unit and providing the first clock signal to the main delay unit output node when the flag signal is in a second state.

20. The method of claim 19 further including generating a plurality of carry and enable signals responsive to the first clock signal and the flag signal.

21. A method of synchronizing an external clock signal to an internal clock signal in a semiconductor memory device, the method comprising:

generating a flag signal responsive to a reset signal;

generating a first clock signal by delaying the external system clock signal for a predetermined first delay time responsive to the flag signal;

generating a second clock signal by delaying the first clock signal for a predetermined second delay time responsive to the flag signal;

detecting a phase difference between the first and the second clock signal;

storing the detected phase difference between the first and the second clock signal;

delaying the first clock signal by a series of connected unit delays to produce a plurality of serially delayed first clock signals;

generating a third clock signal by selecting the delayed first clock signal of the plurality of serially delayed first clock signals having substantially the stored phase difference; and generating the internal clock signal synchronized to the external clock signal by delaying the third clock signal by the predetermined second delay time.

22. The method of claim 21 wherein generating a second clock signal includes applying the first clock signal to a main delay unit when the flag signal is in the first state to thereby delay the first clock signal by the second predetermined delay time and produce a second clock signal at a main delay unit output node.

23. The method of claim 22 wherein generating a first clock signal includes bypassing the main delay unit and providing the first clock signal to the main delay unit output node when the flag signal is in a second state.

24. The method of claim 23 further including generating a plurality of carry and enable signals responsive to the first clock signal and the flag signal.

25. A method of generating a first clock signal by delaying the external system clock signal for a predetermined first delay time;

generating a second clock by delaying the first clock signal for a predetermined second delay time;

detecting a phase difference between the first and the second clock signal;

storing the detected phase difference between the first and the second clock signal;

delaying the first clock signal by a series of connected unit delays to produce a plurality of serially delayed first clock signals;

generating a third clock signal by selecting the delayed first clock signal of the plurality of serially delayed first clock signals having substantially the stored phase difference including enabling at least one of a plurality of switches connected between the unit delays and a third clock signal line; and generating the internal clock signal synchronized to the external clock signal by delaying the third clock signal by the predetermined second delay time.

26. A phase locked delay circuit or generating an internal clock signal synchronized with an external system clock signal, the circuit comprising:

a delay buffer for receiving the external system clock signal, delaying the external system clock for a predetermined first delay time, and outputting the delayed clock signal as a first clock signal;

a main delay unit coupled to said delay buffer for providing the first clock signal to a main delay unit output node using a bypass path when a flag signal is in a high logic state and for generating a second clock signal by delaying the first clock signal for a predetermined second delay time by applying the first clock signal to a main delay and providing the second clock signal to the main delay unit output node responsive to the flag signal being in a low logic state;

a delay line coupled to said main delay unit including a plurality of serially connected unit delays for generating a plurality of sequentially delayed clock signals by receiving either the first or the second clock signal from said main delay unit and sequentially delaying the received signal for a predetermined unit time;

phase synchronization detector coupled to said delay line including a plurality of phase comparison detectors for comparing a phase of each of the sequentially delayed clock signals with a phase of the first clock signal responsive to the flag signal, selecting one of the sequentially delayed clock signals having a phase substantially the same as a phase of the first clock signal, generating a corresponding plurality of enable and carry signals, and activating an enable signal of said plurality of enable signals and a carry signal of said plurality of carry signals corresponding to the selected sequentially delayed clock signal, wherein states of the plurality of enable signals are maintained when the flag is in the high logic state;

a flag signal generator for generating the flag signal responsive to the plurality of carry signals and a reset signal;

a switching unit coupled to said delay line including a plurality of switches for selecting one of the sequentially delayed signals responsive to the active enable signal; and a clock driver for receiving the signal selected by said switching unit, generating the internal clock signal by delaying the received signal for a predetermined third delay time, wherein the predetermined third delay time is equal to the sum of the first and second delay times.

* * * * *